United States Patent
Katayama et al.

(10) Patent No.: US 8,578,239 B2
(45) Date of Patent: Nov. 5, 2013

(54) CALCULATION TECHNIQUE FOR SUM-PRODUCT DECODING METHOD (BELIEF PROPAGATION METHOD) BASED ON SCALING OF INPUT LOG-LIKELIHOOD RATIO BY NOISE VARIANCE

(75) Inventors: Yasunao Katayama, Tokyo (JP); Toshiyuki Yamane, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 12/968,044

(22) Filed: Dec. 14, 2010

(65) Prior Publication Data

US 2011/0145675 A1  Jun. 16, 2011

(30) Foreign Application Priority Data

Dec. 15, 2009  (JP) .................. 2009-283872

(51) Int. Cl.
*G06F 11/00* (2006.01)
(52) U.S. Cl.
USPC ........................................ 714/758
(58) Field of Classification Search
USPC .................. 714/758, 777, 780, 794
See application file for complete search history.

(56) References Cited

U.S. PATENT DOCUMENTS

| | | | |
|---|---|---|---|
| 7,231,577 B2 | 6/2007 | Richardson | |
| 2009/0113256 A1* | 4/2009 | Radosavljevic et al. | 714/699 |
| 2010/0031113 A1* | 2/2010 | Chang et al. | 714/752 |
| 2010/0162075 A1* | 6/2010 | Brannstrom et al. | 714/752 |

FOREIGN PATENT DOCUMENTS

| | | |
|---|---|---|
| JP | 2002-118474 A | 4/2002 |
| JP | 2009-094750 A | 4/2009 |

OTHER PUBLICATIONS

Xiao--Yu Hu, et al, "Efficient Implementations of the Sum-Product Algorithm for Decoding LDPC Codes". 2001 GLOBECOM IEEE, p. 1036-1036E.

* cited by examiner

*Primary Examiner* — Marc Duncan
(74) *Attorney, Agent, or Firm* — Gail H. Zarick; Otterstedt, Ellenbogen & Kammer, LLP

(57) ABSTRACT

One or more embodiments provide a decoding technique (and its approximate decoding technique) enabling a stable operation even if a noise variance is low at the implementation with a fixed-point arithmetic operation having a finite dynamic range. A technique is provided for causing a computer to perform calculation using a sum-product decoding method (belief propagation method) with respect to LDPC or turbo codes. For calculating an update equation of a log extrinsic value ratio from an input, a (separated) correction term is prepared obtained by variable transformation (scale transformation) of the update equation so that the update equation is represented by a sum (combination) of a plurality of terms by transformation of the equation and a communication channel noise variance is a term separated from other terms constituting a sum of a plurality of terms as a term to be a factor (scale factor) by which a log is multiplied. With an estimated communication channel noise variance as an input, the (separated) correction term is approximated by a simple function so as to cause the computer to make calculation (iteration) on the basis of a fixed point on bit strings of finite length (m,f: m is the total number of bits and f is the number of bits allocated to the fractional part).

14 Claims, 7 Drawing Sheets

| SN RATIO OF COMMUNICATION CHANNEL [dB] | 4 | 5 | 6 | 7 |
|---|---|---|---|---|
| SCALE FACTOR $\sigma^2/2$ | 0.1991 | 0.1581 | 0.1256 | 0.0988 |

SCALE FACTOR VALUES OBTAINED IN THE CASE OF
CHANGE IN SN RATIO OF COMMUNICATION CHANNEL

- (m,f) FIXED-POINT REPRESENTATION

- REPRESENTABLE NUMBER RANGE (DYNAMIC RANGE)

$[(-2^{m-1}+1)\cdot(2^{-f}), (2^{m-1}+1)\cdot(2^{-f})]$ SIGNED FIXED DECIMAL $[0, (2^{m-1}-1) * 2^{-f}]$ UNSIGNED FIXED DECIMAL

| SN RATIO IN COMMUNICATION CHANNEL [dB] | 4 | 5 | 6 |
|---|---|---|---|
| FLOATING POINT | 2.82 | 1.36 | 0.84 |
| CONVENTIONAL TECHNIQUE (5,1) FIXED POINT | 3.26 | 1.64 | 1.03 |
| CONVENTIONAL TECHNIQUE (6,1) FIXED POINT | 2.84 | 1.37 | 0.89 |
| THE PRESENT INVENTION (4,3) FIXED POINT | 5.52 | 1.93 | 1.16 |
| THE PRESENT INVENTION (5,4) FIXED POINT | 3.86 | 1.68 | 1.01 |

COMPARISON OF AVERAGE NUMBER OF ITERATIONS

FIG. 8

| MAXIMUM NUMBER OF ITERATIONS | 30 | 50 | 100 | 150 | 200 |
|---|---|---|---|---|---|
| FLOATING POINT | 1.36 | 1.39 | 1.37 | 1.35 | 1.36 |
| CONVENTIONAL TECHNIQUE (5,1) FIXED POINT | 1.64 | 1.85 | 2.20 | 2.83 | 3.26 |
| THE PRESENT INVENTION (4,3) FIXED POINT | 1.93 | 1.94 | 2.01 | 2.00 | 1.94 |
| THE PRESENT INVENTION (5,4) FIXED POINT | 1.68 | 1.72 | 1.69 | 1.69 | 1.72 |

AVERAGE NUMBER OF ITERATIONS OBTAINED BY VARYING MAXIMUM NUMBER OF ITERATIONS

FIG. 9

CALCULATION TECHNIQUE FOR SUM-PRODUCT DECODING METHOD (BELIEF PROPAGATION METHOD) BASED ON SCALING OF INPUT LOG-LIKELIHOOD RATIO BY NOISE VARIANCE

CROSS-REFERENCE TO RELATED APPLICATION

This application claims foreign priority to Japanese Patent application 2009-283872 filed 15 Dec. 2009, the complete disclosure of which is expressly incorporated herein by reference in its entirety for all purposes.

FIELD OF THE INVENTION

The present invention relates to the electrical, electronic and computer arts, and, more particularly, to decoding techniques and the like.

BACKGROUND OF THE INVENTION

Currently, the wireless personal area network (WPAN), which operates within the millimeter-wave spectrum around 60 GHz and has transmission speed of several Gbps, is lively discussed in the IEEE 802.15.3c standardization task group. The current standardization specification defines four WPC codes, LDPC(1440,1340), LDPC(672,588), LDPC(672, 504), and LDPC(672,336) for channel coding. The sum-product decoding method is generally used to decode the LDPC codes. In this decoding method, it is necessary to give the following log-likelihood ratio of the channel output of the n-th transmission bit as input:

$$\lambda_n = \log \frac{P(y_n | x_n = 1)}{P(y_n | x_n = -1)} \quad [\text{Eq. 1}]$$

where $x_n$ is the n-th transmission bit and $y_n$ is the corresponding output information bit from the channel.

For example, if the binary phase shift keying (BPSK) is used as a modulation scheme and the additive white Gaussian noise (AWGN: variance=the square of σ) is assumed as noise, the input log-likelihood ratio is given as follows:

$$\lambda_n = \frac{2y_n}{\sigma^2} \quad [\text{Eq. 2}]$$

where, if the SN ratio of the communication channel is SNR [dB], the AWGN variance or the square of σ is given by:

$$\sigma^2 = 10^{-SNR/10} \quad [\text{Eq. 3}]$$

Moreover, if the communication channel is a binary symmetric channel, the following relation is satisfied:

$$\lambda_n = \begin{cases} \log \frac{p}{1-p}; & y_n = -1 \\ \log \frac{1-p}{p}; & y_n = 1 \end{cases} \quad [\text{Eq. 4}]$$

where an error probability p is given by:

$$p = 0.5 \, \text{erfc}(\sqrt{1/\sigma^2}) \quad [\text{Eq. 5}]$$

As apparent from these equations, the noise variance decreases as the SN ratio of the communication channel increases. As a result, both the average value of the input log-likelihood ratio and the variance increase.

When applying the LDPC codes to an application, which requests a high throughput, such as an uncompressed HDTV video transfer using millimeter-wave transmission system, it is common to implement a decoder by a fixed-point arithmetic operation. In this case, the range of numeric values which the decoder can handle dynamic range) is limited to a finite range. Therefore, if the input log-likelihood ratio is high, an error floor occurs due to an overflow or an underflow, thereby significantly degrading the performance of the decoder.

To prevent the overflow or underflow, it is necessary to prepare a large dynamic range, though it increases the circuit size. Moreover, an actual receiver needs to process received signals by using an AD converter and to input the received signals to a decoder. If high-speed processing is required, a full flash type AD converter is used. The full flash type AD converter provides high-speed AD conversion by arranging a lot of comparators for the input signals and comparing all bits at a time. To obtain output digital signals having a dynamic range of N bits, however, O (2 to N-th power) comparators are needed. Therefore, an increase in the circuit size is inevitable to treat input signals having large values.

U.S. Pat. No. 7,231,577, hereinafter referred to as "Patent Document 1," is entitled "soft information scaling for iterative decoding."

X.-Y. Hu, E. Eleftheriou, D-M Arnold, and A. Dholakia, "Efficient Implementations of the Sum-Product Algorithm for Decoding LDPC Codes," GLOBECOM 2001, is hereinafter referred to as "Non-patent Document 1," and is completely incorporated herein by reference in its entirety for all purposes.

SUMMARY OF THE INVENTION

Principles of the invention provide techniques for calculation for sum-product decoding method (belief propagation method) based on scaling of input log-likelihood ratio by noise variance. In one aspect, one or more embodiments provide a decoding method (and its approximate decoding method) which enables a stable operation when it is implemented by a fixed-point arithmetic operation of finite dynamic range, even when the low noise variance is low.

In one aspect, an exemplary method is provided for causing a computer to perform steps of calculation using a belief propagation method as a part of a process for decoding at least one of LDPC and turbo codes. The method includes the step of preparing a (separated) correction term obtained by variable transformation (scale transformation) of an update equation of a log extrinsic value ratio in the belief propagation method, for calculating the update equation, so that the update equation is represented by a sum (combination) of a plurality of terms by transformation of the equation, and a communication channel noise variance is a term separated from other terms constituting a sum of a plurality of terms as a term to be a factor (scale factor) by which a log is multiplied. The method also includes the step of approximating the (separated) correction term by a simple function so as to cause the computer to make calculation (iteration) on the basis of a fixed point on bit strings of finite length (m,f: m is the total number of bits and f is the number of bits allocated to the fractional part) with an estimated variance of a communication channel noise as an input.

In another aspect, an exemplary method is provided for causing a computer to perform steps of calculation using a belief propagation method as a part of a process for decoding at least one of LDPC and turbo codes. The method includes the step of preparing a (separated) correction term obtained by variable transformation (scale transformation) of an update equation of a log extrinsic value ratio in the belief propagation method, for (iteratively) calculating the update equation, so that an a updating unit in the update equation is configured to directly receive an input of a channel output, instead of an input of a log-likelihood ratio of the channel output as a normal input. The method also includes approximating the (separated) correction term by a simple function so as to cause the computer to make calculation (iteration) on the basis of a fixed point on bit strings of finite length (m,f: m is the total number of bits and f is the number of bits allocated to the fractional part) with an estimated variance of a communication channel noise as an input.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), or (ii) a combination of hardware and software modules; any of (i)-(ii) implement the specific techniques (e.g., corresponding equations) set forth herein, and the software modules are stored in a computer-readable storage medium (or multiple such media).

These and other features and advantages of the present invention will become apparent from the following detailed description of illustrative embodiments thereof, which is to be read in connection with the accompanying drawings.

BRIEF DESCRIPTION OF THE DRAWINGS

FIG. 8 is a diagram illustrating an average number of iterations for the techniques when the maximum number of iterations is set to 30 in order to estimate the calculation amount in one or more embodiments of the present invention; and FIG. 9 is a diagram illustrating how the average number of iterations in an error floor region (SNR=5 dB) of the conventional technique ((5,1)-fixed point) varies according to the maximum number of iterations.

DETAILED DESCRIPTION OF PREFERRED EMBODIMENTS

Aspects of the present invention relate to decoding, and particularly to calculation and a decoder using a sum-product decoding method (belief propagation method) as a part of a process for decoding (LDPC or turbo) codes.

One or more embodiments of the invention address the overflow and underflow problems by considering scaling by noise variance of the input log-likelihood ratio. On the other hand, the invention according to Patent Document 1 is intended to improve the performance of a decoder by scaling a channel output with an appropriate constant. The main point of the invention according to Patent Document 1 is to determine a scale factor by solving a capacity estimate equation so that a channel capacity calculated from the channel output coincides with a given channel capacity without assuming a particular communication channel. The invention according to Patent Document 1, however, does not treat the implementation with a fixed point and therefore is not applicable to the overflow problem.

One or more embodiments of the invention start with the same equation as the equation disclosed in Non-patent Document 1 for transformation for the sum-product decoding. This technique of Non-patent Document 1 does not solve the problem addressed by one or more embodiments of the invention, which may occur when the value of the input log-likelihood ratio is high.

Figure 1:
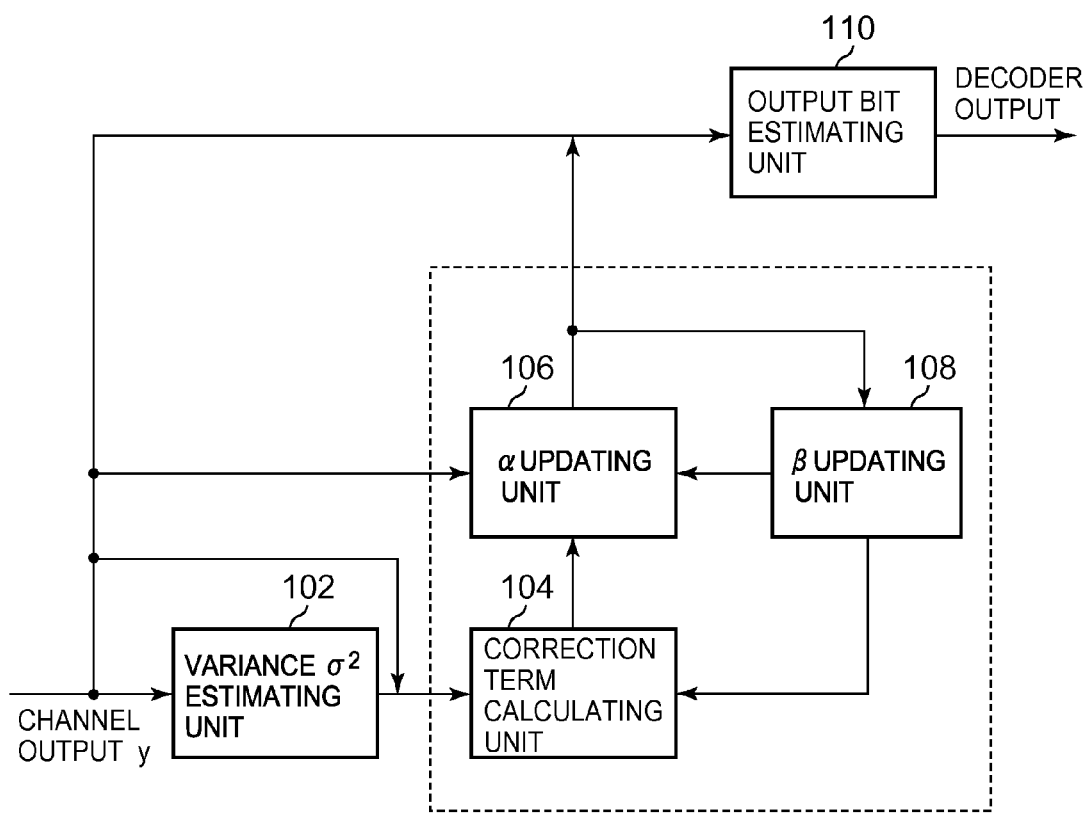
FIG. 1 is a diagram illustrating the configuration of a decoder in which the present invention is embodied.

FIG. 1 shows a diagram 100 illustrating the configuration of a decoder in which the present invention is embodied.

A "variance $\sigma^2$ (the square of $\sigma$) estimating unit" 102 is a unit for estimating a noise variance in a situation where AWGN is assumed as a channel noise. An appropriate existing technique can be used to estimate this noise variance.

A "correction term calculating unit" 104 is a unit for calculating a correction term from a channel output and β and this unit is the basis of one or more embodiments of the present invention (as described later, corresponding to the underlined part in Eq. 9 or Eq. 12 approximated to the part). Specifically, the calculating unit has an input means for inputting a channel output, an estimated variance value, and a variable β represented in a fixed-point number. Further, it has an arithmetic operating means including an adder, a multiplier, and an operator of logarithmic and exponential functions for the correction term in Eq. 9 and has only the adder and the multiplier for the correction term in Eq. 12. Moreover, it is an arithmetic unit having an output unit for outputting a result of the operations by these units.

Although the input means, the arithmetic operating means including the adder, the multiplier, and the operator of logarithmic and exponential functions, and the output unit for outputting the result of the operations by these units will be typically implemented as hardware when seeking high-speed processing power, it is also possible to implement the above means and unit in a flexible form such as software (computer program) or a combination of hardware and software. Moreover, they can be implemented as single means, respectively, or a mean, a unit, or a system including composite functions.

An "α updating unit" 106 is a unit for updating the value of a log extrinsic value ratio α from a channel output, a correction term, and β and corresponds to Eq. 9. Specifically, it is an arithmetic unit having an input means for inputting the channel output, the correction term, and the variable β value each represented in a fixed-point representation, an arithmetic operating means including an adder, a sign determination unit, and a minimum value operator, and an output unit for outputting a result of the operation in Eq. 9.

While a log-likelihood ratio of a channel output is all input to the "α updating unit" in the normal sum-product algorithm, one or more embodiments of the present invention differ from the conventional sum-product algorithm in that the channel output is directly input to the "α updating unit." It results from scaling with noise variance of the entire algorithm in one or more embodiments of the present invention and prevents the problem that the input log-likelihood ratio increases as the noise variance decreases in the conventional technique.

A "β updating unit" 108 is a unit for updating a log prior value ratio β and corresponds to Eq. 13.

An "output bit estimating unit" 110 is a unit for calculating an output of the decoder after repeating the sum-product algorithm for a predetermined number of times and corresponds to Eq. 14.

The part enclosed by a dotted line is the body of the sum-product algorithm in or more embodiments of the present invention and this part is repeated for a predetermined number of times. Although described later, if there are a plurality of check nodes, the "correction term calculating unit" and the "α updating unit", which are calculating units of two check nodes, are recursively repeated with respect to each check node.

Eq. 6 represents an update equation of a log extrinsic value ratio of the sum-product decoding method for the case of two check nodes as shown below. The equation is well known to those skilled in the art.

$$\alpha = 2 \tan h^{-1}(\tan h(\lambda/2+\beta/2)\tan h(\lambda'/2+\beta'/2)) \quad [\text{Eq. 6}]$$

Figure 2:
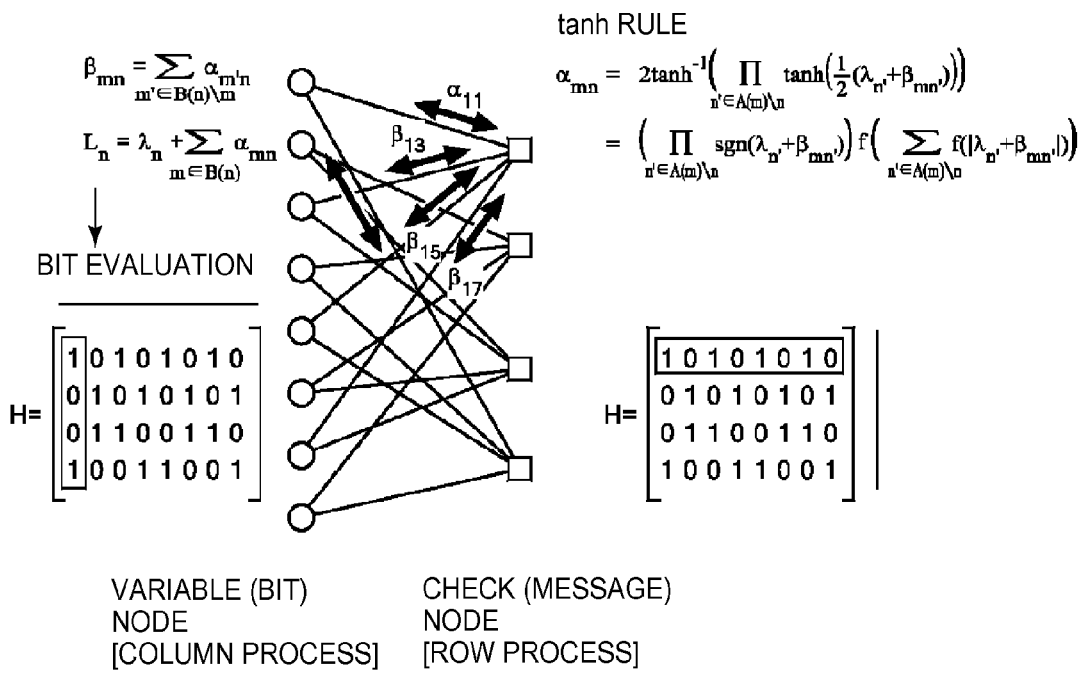
FIG. 2 is a diagram for describing an example of the algorithm of a sum-product decoding method in which a recursive calculation is repeated for α updating unit and β updating unit.

FIG. 2 shows a diagram for describing an example of the algorithm of the sum-product decoding method in which a recursive calculation is repeated in the α updating unit and the β updating unit. The sum-product decoding method is one of belief propagation (abbreviated to BP) methods. There is another decoding method whose principle is the same as the belief propagation method, a Log-MAP decoding method (or a turbo decoding method) for decoding turbo codes (serial concatenated convolutional codes [abbreviated to SCCC]). The Log-Map decoding algorithm for Turbo codes corresponds to the sum-product decoding method for LDPC codes. The decoding method of one or more embodiments of the present invention is widely applicable to both decoding methods.

Figure 3:
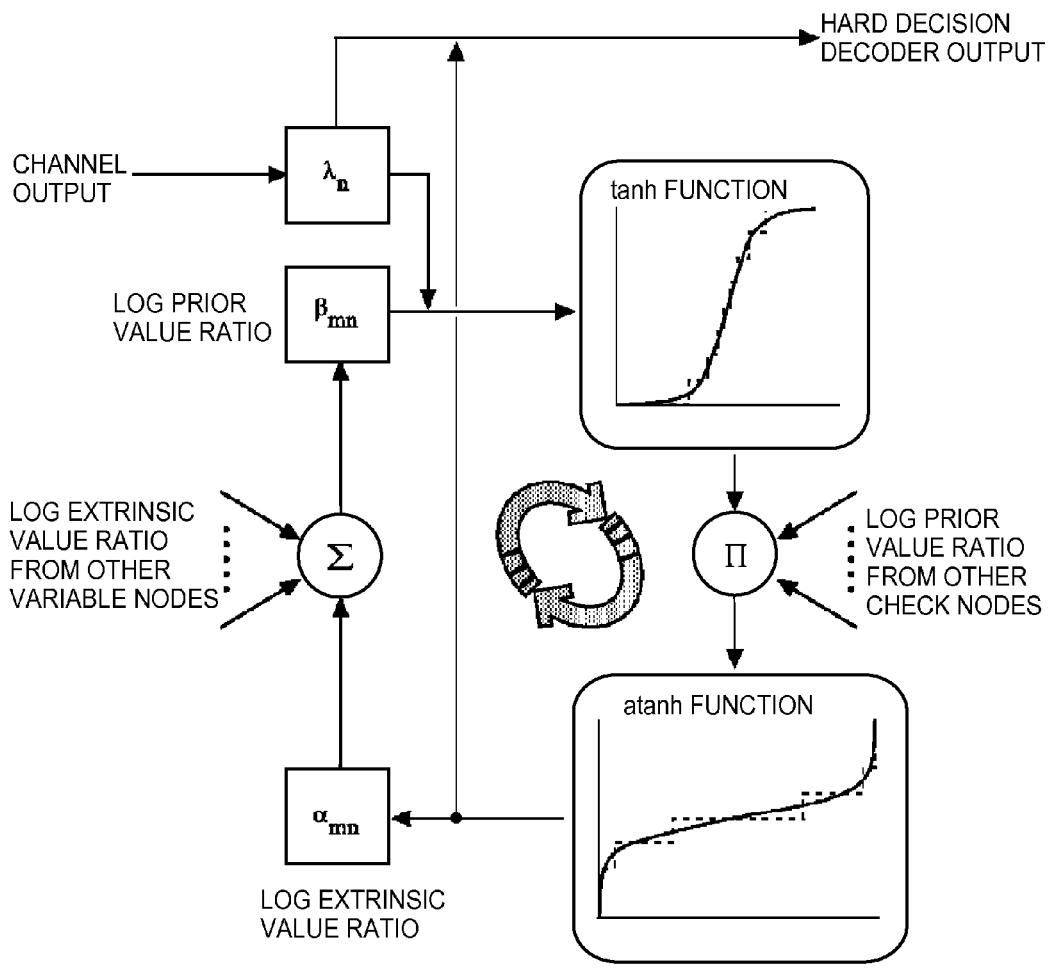
FIG. 3 is a diagram in which the algorithm shown in FIG. 2 is represented by a block diagram.

FIG. 3 shows a diagram in which the algorithm shown in FIG. 2 is represented by a block diagram.

To calculate Eq. 6 digitally by using a computer, recursive and iterative calculation as shown in FIG. 2 and FIG. 3 is performed, which is well known to those skilled in the art.

Eq. 6 can be transformed to Eq. 7 as described in Non-patent Document 1.

$$\alpha = sgn(\lambda/2+\beta/2)sgn(\lambda'/2+\beta'/2)\min(|\lambda/2+\beta/2|,|\lambda'/2+\beta'/2|)+\log(1+e^{-|\lambda/2+\beta/2+\lambda'/2+\beta'/2|})-\log(1+e^{-|\lambda/2+\beta/2-\lambda'/2-\beta'/2|}). \quad [\text{Eq. 7}]$$

As a result of variable transformation (scale transformation.) according to the arrows (→) in Eq. 8, Eq. 9 is obtained:

$$\lambda = 2y/\sigma^2,$$

$$\beta/2 \to \beta/\sigma^2,$$

$$\alpha/2 \to \alpha/\sigma^2,$$

$$\lambda' = 2y'/\sigma^2,$$

$$\beta'/2 \to \beta'/\sigma^2,$$

$$\alpha'/2 \to \alpha'/\sigma^2 \quad [\text{Eq. 8}]$$

$$\begin{aligned}\alpha &= \sigma^2 \cdot \tanh^{-1}\left(\tanh\left(\frac{y}{\sigma^2}+\frac{\beta}{\sigma^2}\right)\tanh\left(\frac{y'}{\sigma^2}+\frac{\beta'}{\sigma^2}\right)\right) \\ &= sgn(y+\beta)sgn(y'+\beta')\min(|y+\beta|,|y'+\beta'|)+ \\ &\quad \underline{\sigma^2\log\left(1+e^{-\frac{|y+\beta+y'+\beta'|}{\sigma^2}}\right)-\sigma^2\log\left(1+e^{-\frac{|y+\beta-y'-\beta'|}{\sigma^2}}\right)}\end{aligned} \quad [\text{Eq. 9}]$$

Eq. 9 differs from Eq. 7 in that λn=yn is used instead of the likelihood ratio λn=2yn/(the square of σ) in the normal sum-product decoding method.

Describing the variable transformation (scale transformation), there is prepared a (separated) correction term obtained by variable transformation (scale transformation) so that the update equation is represented by a sum (combination) of a plurality of terms by transformation of the equation and a communication channel noise variance (the square of a for an additive white Gaussian noise [AWGN]) is a term separated from other terms constituting a sum of a plurality of terms as a term to be a factor (scale factor) by which a log is multiplied.

Therefore, in one or more embodiments, it is important that the underlined part converges to zero as the square of σ decreases. Therefore, even if the SN ratio is improved and the value of the AWGN variance is low, it could not lead to an overflow or an underflow.

Although directly-calculated Eq. 9 is equivalent to the original sum-product decoding method, the decoding implementation cost is able to be significantly reduced as a whole by approximating the underlined part (hereinafter, referred to as "correction term") with a simple function. If the following is defined:

$$f(x) = \sigma^2 \log(1+e^{-x/\sigma^2}) \quad [\text{Eq. 10}]$$

the correction term can be written as follows:

$$f(|y+\beta+y'+\beta'|)-f(|y+\beta-y'-\beta'|) \quad [\text{Eq. 11}]$$

Therefor f(x) may be approximated with a simple function in the implementation. As an approximation technique, it is possible to use the piecewise linear approximation, which is an existing technique. A simple and easy approximation is achieved in the implementation, for example, by the approximation with the following piecewise linear function:

$$f(x) \approx \begin{cases} -\frac{1}{2}x+\sigma^2\log 2 & (0 \le x \le 2\sigma^2\log 2) \\ 0 & (2\sigma^2\log 2 \le x) \end{cases} \quad [\text{Eq. 12}]$$

Naturally, the present invention does not depend on a particular form of this piecewise linear approximation. Those skilled in the art could apply various simple functions. Moreover, the term "simple functions" does not necessarily mean absolutely-simple functions in the basis sense, but should be understood as applicable to a wide range of functions as long as it is used for convenience to cause a computer to make a calculation.

Figures 4, 5:
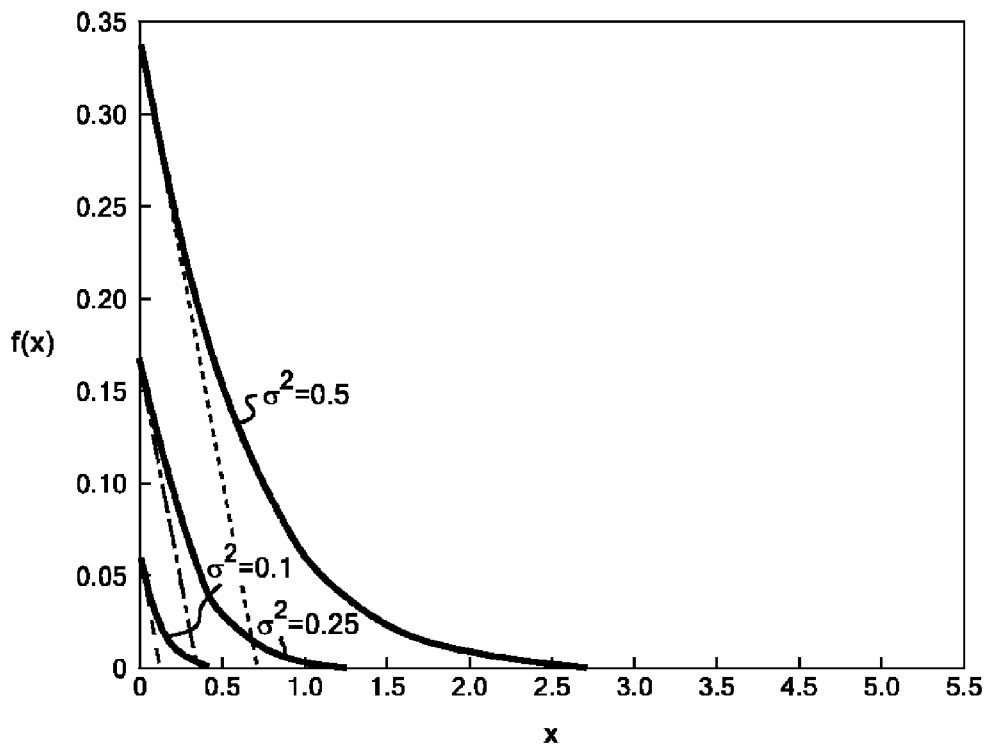
FIG. 4 is a diagram illustrating the forms of the function f(x) with respect to different $\sigma^2$ (the square of $\sigma$) values and the piecewise linear approximations for each.
FIG. 5 is a diagram summarizing the scale factor values $\sigma_2$ (the square of $\sigma$)/2 obtained in the case of a change in the SN ratio of the communication channel.

FIG. 4 shows a diagram illustrating the function form of f(x) with respect to different $\sigma^2$ (the square of $\sigma$) values and the piecewise linear approximation therefor. The solid lines represent correction terms and the dotted lines represent piecewise linear approximations. For example, as another approximation method with "a simple function", f(x) may be approximated with a step function. Moreover, if there are three or more check nodes, Eq. 9 may be used repeatedly. It is because, if an operator Min* is defined as Min*(x1, x2, - - - xn)=2 a tan h (tan h (x1/2) tan h (x2/2) - - - tan h (xn/2)), it is satisfied that Min*(x, y, z)=Min*(Min*(x, y), z) Min*(x, Min*(y, z)) and therefore it is possible to reduce to the repetition of the Min* arithmetic operation with two arguments if there are three or more check nodes.

On the other hand, the update equation of the log prior value ratio β with variable nodes in the sum-product decoding method has the following simple form of a sum:

$$\beta_{mn} = \sum_m \alpha_{mn} \quad [\text{Eq. 13}]$$

Therefore, the above variable scale transformation does not change the update equation at all.

Moreover, since the following operation for obtaining the values of the final estimated bits by hard decision includes only a linear calculation and the decision of positive or negative values:

$$L_n = \lambda_n + \sum_m \alpha_{mn} \quad [\text{Eq. 14}]$$

$$\hat{c}_n = 0 \quad (L_n > 0),$$
$$= 1 \quad (L_n < 0)$$

the above variable scale transformation does not change the operation.

FIG. 5 shows a diagram summarizing the values of the scale factor $\sigma^2$ (the square of $\sigma$)/2 obtained in the case of a change in the SN ratio of the communication channel.

The advantageous effect of one or more embodiments of the present invention can be summarized by describing scale factors $\sigma^2$ (the square of $\sigma$)/2 for some SN ratios of the communication channel. As apparent from FIG. 5, the scale factor is always smaller than 1 in the range of the SN ratio in which the decoder normally operates. Therefore, it is understood that the input log-likelihood ratio remains at low levels correspondingly.

Subsequently, comparison of the effect between the conventional calculation technique and the calculation technique of one or more embodiments of the present invention will be made using simulation with respect to a case where these techniques are implemented in a fixed-point representation. The target LDPC code is LDPC(672,588).

Figure 6:
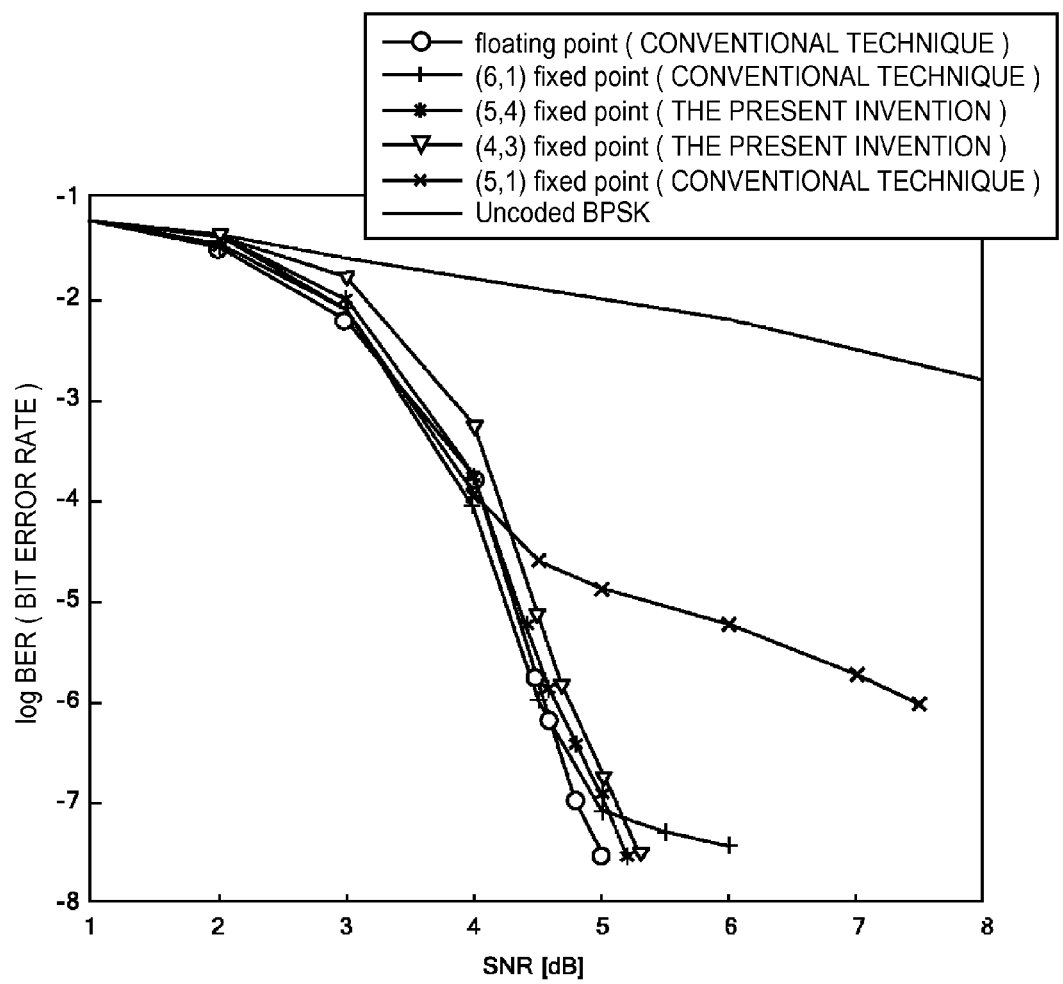
FIG. 6 is a diagram illustrating comparison of the effect between a conventional calculation technique and a technique of one or more embodiments of the present invention obtained by simulation with respect to a case where these techniques are implemented using a fixed-point representation.

FIG. 6 shows a diagram illustrating comparison of the effect between the conventional calculation technique and the technique of one or more embodiments of the present invention obtained by simulation with respect to a case where these techniques are implemented using a fixed-point representation. The diagram shows the simulation with an ideal floating point, a (5,1)-fixed point, and a (6,1)-fixed point for the conventional technique. In this regard, the (m,f)-fixed point represents a fixed point in which m is the total number of bits and f is the number of bits among them allocated to the fractional part.

Figure 7:
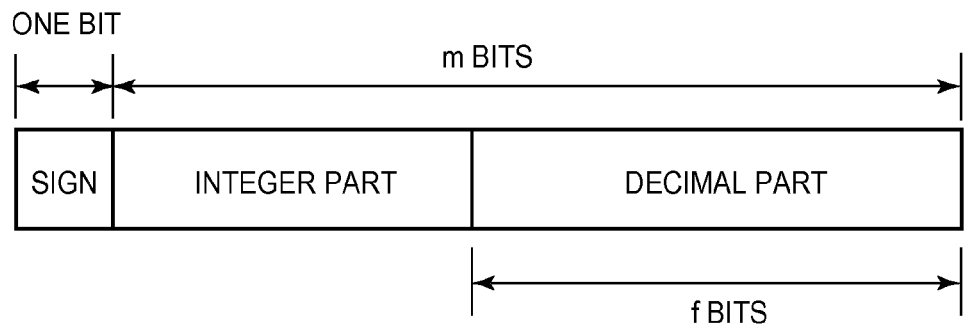
FIG. 7 is a diagram for describing an implementation by fixed point number with a (m,f)-fixed-point representation in which m is the total number of bits and f is the number of bits among them allocated to fractional part.
Figure 7:
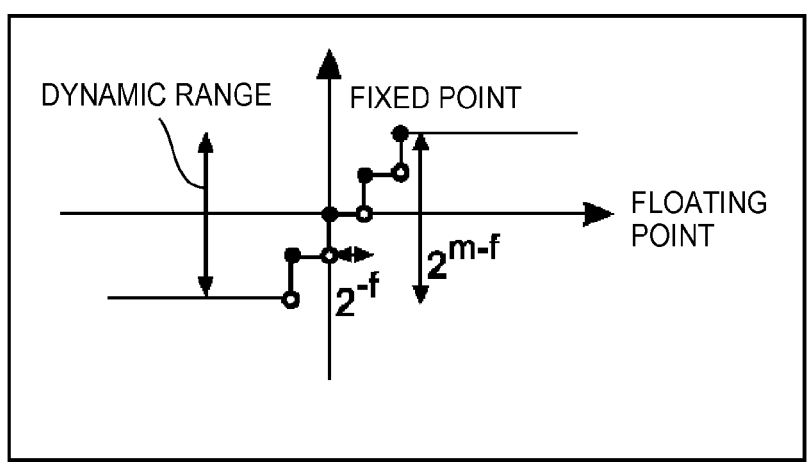

FIG. 7 shows a diagram for describing an implementation of a fixed point in bits with a (m,f)-fixed-point representation in which m is the total number of bits and f is the number of bits among them allocated to the fractional part. The diagram illustrates the relationship among an overflow, an underflow, a floating point, a dynamic range, and signed/unsigned. Two horizontal lines along the horizontal axis on the graph with the floating point as the horizontal axis and the fixed point as the vertical axis shows that, if the overflow or underflow occurs, the value is replaced with the maximum value or the minimum value.

As apparent from FIG. 6, an overflow occurs in the case of the (5,1)-fixed point and an error floor occurs at high SN ratios in the conventional technique.

Particularly, it is problematic that the performance is significantly deteriorated in the bit error rate region of $10^{-5}$ (the minus fifth power) to $10^{-6}$ (the minus sixth power) which is required in wireless communication. If the integer part is increased by one bit and the (6,1)-fixed point is used, no error floor occurs at $10^{-5}$ to $10^{-6}$ bit error rates. In a lower bit error rate region of $10^{-7}$ or lower, however, an error floor still occurs.

On the other hand, the same FIG. 6 shows a result of a case where the (5,4)-fixed point and the (4,3)-fixed point are used in one or more embodiments of the present invention. In the technique of one or more embodiments of the present invention, no error floor occurs in the bit error rate region of $10^{-5}$ to $10^{-6}$ when using the (5,4)-fixed point having the same 5-bit length. Moreover, when using the (4,3)-fixed point which is one bit decreased in the decimal part, the performance is lower in the low SN ratio region, but the loss remains at about 0.1 to 0.2 dB in the high SN ratio region. While it is necessary to increase the bit length in order to prevent an error floor in the high SN ratio region caused by a fixed-point arithmetic operation in the conventional technique, it is possible to prevent the error floor advantageously without increasing the bit length even in the high SN ratio region in one or more embodiments of the present invention.

FIG. 8 shows a diagram illustrating an average number of iterations for the techniques when the maximum number of iterations is set to 30 in order to estimate the calculation amount in one or more embodiments of the present invention.

While the average number of iterations is slightly high in the technique of one or more embodiments of the present invention in comparison with a case of using the fixed points in the conventional technology in the low SN ratio (4 dB or lower) region, it gradually gets close to the average number of iterations in the conventional technique in the SN ratio region of 5 dB or higher.

FIG. 9 shows a diagram illustrating how the average number of iterations in an error floor region (SNR=5 dB) of the conventional technique ((5,1)-fixed point) varies according to the maximum number of iterations.

If an error floor occurs in the conventional technique, an increase in the maximum number of iterations causes an increase in the average number of iterations. It is because an uncorrectable error occurs even if decoding is repeated up to the maximum number of iterations in the error floor region. On the other hand, in the technique according to one or more embodiments of the present invention, it is understood that there is no change in the average number of iterations even if the maximum number of iterations is increased similarly to the case of the use of the floating point.

(A part or all of) the configuration of the decoder, in which the present invention is embodied, is implemented as a system for performing calculation, and typically as hardware, when seeking an increase in practical processing speed. It is also possible to carry out a combination of hardware and software cooperating with each other by embodying a part of the configuration as software. For example, a part of the configuration can be implemented in the field programmable array (FPGA) as a program which causes a computer to perform calculation.

The belief propagation method has a feature of being essentially suitable for computer application because a plurality of discrete bits and conditional branches are used in the belief propagation method itself. Moreover, if the piecewise linear function or the step function is selected as a "simple function," the computer hardware source can be used more efficiently by preparing a lookup table (LUT).

Having reviewed the disclosure herein, the skilled artisan will appreciate that aspects of the present invention may be implemented using integrated circuit chips which can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any suitable product that includes integrated circuit chips.

Furthermore, having reviewed the disclosure herein, the skilled artisan will appreciate that aspects of the present invention may be embodied as a system, method or computer program product. Accordingly, aspects of the present invention may take the form of an entirely hardware embodiment or an embodiment combining software (including firmware, resident software, micro-code, etc.) and hardware aspects that may all generally be referred to herein as a "circuit," "module" or "stem." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Some implementations might employ, for example, a processor, a memory, and optionally an input/output interface. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit, and one or more mechanisms for providing results associated with the processing unit. The processor, memory, and input/output interface can be interconnected, for example, via a bus as part of a data processing unit. Suitable interconnections, for example via bus, can, in some cases, be provided to a network interface, such as a network card, which can be provided to interface with a computer network, and to a media interface, such as a diskette or CD-ROM drive, which can be provided to interface with media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor coupled directly or indirectly to memory elements through a system bus. The memory elements can include local memory employed during actual implementation of the program code, bulk storage, and cache memories which provide temporary storage of at least some program code in order to reduce the number of times code must be retrieved from bulk storage during implementation.

Input/output or I/O devices can be coupled to the system either directly (such as via bus) or through intervening I/O controllers.

Network adapters such as a network interface may also be coupled to the system to enable the data processing system to become coupled to other data processing systems or remote printers or storage devices through intervening private or public networks. Modems, cable modem and Ethernet cards are just a few of the currently available types of network adapters.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, or combinations of software and hardware; for example, application specific integrated circuit(s) (ASICS), functional circuitry, one or more appropriately programmed general purpose digital computers with associated memory, the aforementioned FPGAs, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for causing a computer to perform steps of calculation using a belief propagation method as a part of a process for decoding at least one of LDPC and turbo codes, the method comprising the steps of:
   preparing a separated correction term obtained by variable transformation of an update equation of a log extrinsic value ratio in the belief propagation method, for calculating the update equation, so that:
      the update equation is represented by a sum of a plurality of terms by transformation of the equation, and
      a communication channel noise variance is a term separated from other terms constituting a sum of a plurality of terms as a term to be a factor by which a log is multiplied; and
   approximating the separated correction term by a simple function so as to cause the computer to make iterative calculation on the basis of a fixed point on bit strings of finite length with an estimated variance of a communication channel noise as an input.

2. The method according to claim 1, wherein the communication channel noise is an additive white Gaussian noise and the communication channel noise variance is a square of σ.

3. The method according to claim 1, wherein the simple function is a piecewise linear function or a step function.

4. The method according to claim 1, further comprising the steps of:
estimating the noise variance on a communication channel from the channel output with an SN ratio on the communication channel as an input;
estimating an optimal bit string by hard decision on the basis of the bit strings with the fixed point; and
outputting a decoded result on the basis of the estimated optimal bit string.

5. A method for causing a computer to perform steps of calculation using a belief propagation method as a part of a process for decoding at least one of LDPC and turbo codes, the method comprising the steps of:
preparing a separated correction term obtained by variable transformation of an update equation of a log extrinsic value ratio in the belief propagation method, for iteratively calculating the update equation, so that an α updating unit in the update equation is configured to directly receive an input of a channel output, instead of an input of a log-likelihood ratio of the channel output as a normal input; and
approximating the separated correction term by a simple function so as to cause the computer to make iterative calculation on the basis of a fixed point on bit strings of finite length with an estimated variance of a communication channel noise as an input.

6. The method according to claim 5, wherein the communication channel noise is an additive white Gaussian noise and the communication channel noise variance is a square of σ.

7. The method according to claim 5, wherein the simple function is a piecewise linear function or a step function.

8. The method according to claim 5, further comprising the steps of:
estimating the noise variance on a communication channel from the channel output with an SN ratio on the communication channel as an input;
estimating an optimal bit string by hard decision on the basis of the bit strings with the fixed point; and
outputting a decoded result on the basis of the estimated optimal bit string.

9. A system for performing calculation using a belief propagation method as a part of a process for decoding at least one of LDPC and turbo codes, the system comprising:
means for preparing a separated correction term obtained by variable transformation of an update equation of a log extrinsic value ratio in the belief propagation method, for calculating the update equation, so that:
the update equation is represented by a sum of a plurality of terms by transformation of the equation, and
a communication channel noise variance is a term separated from other terms constituting a sum of a plurality of terms as a term to be a factor by which a log is multiplied; and
means for approximating the separated correction term by a simple function to make iterative calculation on the basis of a fixed point on bit strings of finite length with an estimated variance of a communication channel noise as an input.

10. The system according to claim 9, further comprising:
means for estimating the noise variance on a communication channel from the channel output with an SN ratio on the communication channel as an input;
means for estimating an optimal bit string by hard decision on the basis of the bit strings with the fixed point; and
means for outputting a decoded result on the basis of the estimated optimal bit string.

11. A system for performing calculation using a belief propagation method as a part of a process for decoding at least one of LDPC and turbo codes, the system comprising:
means for preparing a separated correction term obtained by variable transformation of an update equation of a log extrinsic value ratio in the belief propagation method, for iteratively calculating the update equation, so that an α updating unit in the update equation is configured to directly receive an input of a channel output, instead of an input of a log-likelihood ratio of the channel output as a normal input; and
means for approximating the separated correction term by a simple function to make iterative calculation on the basis of a fixed point on bit strings of finite length with an estimated variance of a communication channel noise as an input.

12. The system according to claim 11, further comprising:
means for estimating the noise variance on a communication channel from the channel output with an SN ratio on the communication channel as an input;
means for estimating an optimal bit string by hard decision on the basis of the bit strings with the fixed point; and
means for outputting a decoded result on the basis of the estimated optimal bit string.

13. A computer program product for causing a computer to perform steps of calculation using a belief propagation method as a part of a process for decoding at least one of LDPC and turbo codes, the computer program product comprising:
a non-transitory tangible computer readable storage medium having computer readable program code embodied therewith, the computer readable program code comprising:
computer readable program code configured to prepare a separated correction term obtained by variable transformation of an update equation of a log extrinsic value ratio in the belief propagation method, for calculating the update equation, so that:
the update equation is represented by a sum of a plurality of terms by transformation of the equation, and
a communication channel noise variance is a term separated from other terms constituting a sum of a plurality of terms as a term to be a factor by which a log is multiplied; and
computer readable program code configured to approximate the separated correction term by a simple function so as to cause the computer to make iterative calculation on the basis of a fixed point on bit strings of finite length with an estimated variance of a communication channel noise as an input.

14. A computer program product for causing a computer to perform steps of calculation using a belief propagation method as a part of a process for decoding at least one of LDPC and turbo codes, the computer program product comprising:
a non-transitory tangible computer readable storage medium having computer readable program code embodied therewith, the computer readable program code comprising:

computer readable program code configured to prepare a separated correction term obtained by variable transformation of an update equation of a log extrinsic value ratio in the belief propagation method, for iteratively calculating the update equation, so that an $\alpha$ updating unit in the update equation is configured to directly receive an input of a channel output, instead of an input of a log-likelihood ratio of the channel output as a normal input; and computer readable program code configured to approximate the separated correction term by a simple function so as to cause the computer to make iterative calculation on the basis of a fixed point on bit strings of finite length with an estimated variance of a communication channel noise as an input.

* * * * *